(12) United States Patent
Williams et al.

(10) Patent No.: US 11,178,791 B2
(45) Date of Patent: Nov. 16, 2021

(54) APPARATUS FOR INCREASING HEAT DISSIPATION CAPACITY OF A DIN RAIL MOUNTED ENCLOSURE

(71) Applicant: SCHNEIDER ELECTRIC USA, INC., Andover, MA (US)

(72) Inventors: Jeffrey Scott Williams, Nashville, TN (US); Gary Lenn Mayes, Murfreesboro, TN (US); Michael James Farrell, Broomfield, CO (US)

(73) Assignee: SCHNEIDER ELECTRIC USA, INC., Andover, MA (US)

( * ) Notice: Subject to any disclaimer, the term of this patent is extended or adjusted under 35 U.S.C. 154(b) by 974 days.

(21) Appl. No.: 15/107,681

(22) PCT Filed: Dec. 30, 2013

(86) PCT No.: PCT/US2013/078241
§ 371 (c)(1),
(2) Date: Jun. 23, 2016

(87) PCT Pub. No.: WO2015/102560
PCT Pub. Date: Jul. 9, 2015

(65) Prior Publication Data
US 2016/0330869 A1 Nov. 10, 2016

(51) Int. Cl.
*H05K 7/20* (2006.01)
*H05K 7/14* (2006.01)

(52) U.S. Cl.
CPC ....... *H05K 7/20472* (2013.01); *H05K 7/1474* (2013.01)

(58) Field of Classification Search
CPC ............. H05K 7/20472; H05K 7/1474; H05K 7/1489; H05K 7/183

(Continued)

(56) References Cited

U.S. PATENT DOCUMENTS 5,414,593 A 5/1995 Furlan
5,946,193 A 8/1999 Hendrix et al.
(Continued)

FOREIGN PATENT DOCUMENTS

CN 101763149 A 6/2010
CN 101865731 A 10/2010
(Continued)

OTHER PUBLICATIONS

Notification of transmittal of the International Search Report and the Written Opinion of the International Searching Authority from corresponding PCT/US2013/078241 dated Apr. 29, 2014.
(Continued)

*Primary Examiner* — Peter Dungba Vo
*Assistant Examiner* — Azm A Parvez
(74) *Attorney, Agent, or Firm* — Lando & Anastasi, LLP

(57) ABSTRACT

A mounting enclosure assembly is configured to mount electronic components onto a DIN rail. The mounting enclosure assembly includes a mounting bracket including a body having at least one elongate slot configured to receive an edge of the electronic component therein. The mounting enclosure assembly further includes a heat sink secured to the mounting bracket. The heat sink includes a mounting configuration configured to secure the heat sink and the mounting bracket to the DIN rail. The mounting enclosure assembly further includes a thermal bonding material disposed within the slot to secure the electronic component to the body of the mounting bracket within the slot. Other embodiments of the mounting enclosure assembly are further disclosed.

21 Claims, 8 Drawing Sheets

(58) Field of Classification Search
USPC .................. 29/832, 829, 825; 361/692, 721
See application file for complete search history.

(56) References Cited

U.S. PATENT DOCUMENTS

| | | | |
|---|---|---|---|
| 6,563,710 | B1 | 5/2003 | Okuda et al. |
| 7,843,691 | B2* | 11/2010 | Reichert ................. G06F 1/203 |
| | | | 361/695 |
| 2005/0234681 | A1 | 10/2005 | Johnson et al. |
| 2010/0128448 | A1* | 5/2010 | WenLong .............. H02B 1/052 |
| | | | 361/747 |
| 2010/0232114 | A1 | 9/2010 | Jain |
| 2010/0314522 | A1* | 12/2010 | Molnar ................. H02B 1/052 |
| | | | 248/346.06 |
| 2011/0061591 | A1 | 3/2011 | Stecker |
| 2011/0273844 | A1 | 11/2011 | Rivera Hernandez et al. |
| 2013/0188320 | A1* | 7/2013 | Moore ............... H05K 7/20509 |
| | | | 361/721 |
| 2013/0229775 | A1* | 9/2013 | Crisp .................... H05K 7/183 |
| | | | 361/726 |
| 2015/0168181 | A1* | 6/2015 | Turnbeaugh ........... G01B 21/16 |
| | | | 702/159 |

FOREIGN PATENT DOCUMENTS

| | | | | |
|---|---|---|---|---|
| CN | 202930319 U | 5/2013 | | |
| EP | 0476322 A1 | 3/1992 | | |
| EP | 0740499 A1 | 10/1996 | | |
| EP | 2551973 A1 * | 1/2013 | ........... H05K 7/1411 |
| JP | H09162574 A | 6/1997 | | |

OTHER PUBLICATIONS

Extended European Search Report from corresponding European Application No. 13900733.0 dated Jul. 20, 2017.

* cited by examiner

APPARATUS FOR INCREASING HEAT DISSIPATION CAPACITY OF A DIN RAIL MOUNTED ENCLOSURE

CROSS-REFERENCE TO RELATED APPLICATIONS

This application is a U.S. National Stage Application under 35 U.S.C. § 371 of International Application No. PCT/US2013/078241, filed Dec. 30, 2013, titled METHOD AND APPARATUS FOR INCREASING HEAT DISSIPATION CAPACITY OF A DIN RAIL MOUNTED ENCLOSURE, which is hereby incorporated herein by reference in its entirety.

BACKGROUND

1. Field of Disclosure

The present disclosure relates generally to the field of electronics and, more particularly, to devices and methods that remove or dissipate heat from electronic components.

2. Discussion of Related Art

Modern electronic components produce excessive amounts of heat during operation. To ensure that the components do not overheat, system designers attach convective heat sinks to cool these components, by providing an efficient heat transfer path from the devices to the environment. A typical convective heat sink is designed to transfer heat energy from the high temperature component to lower temperature of the surrounding air. Such typical heat sinks attach to the components through a base and include fins or pins to increase the surface area of the heat sink within a given space.

Within rack enclosures, embedded systems demand more and more features running on faster processors and must be enclosed in smaller packages. One of the main design challenges associated with these products is thermal management. Typically, natural air convection patterns are tuned for maximum chimney effect to pull outside cooler air in and to push inside heated air out of the enclosure. However, every enclosure has its own maximum thermal capacity based on several physical properties, such as total cubic volume, location of heat producing components, enclosure material, and proper ventilation design. Far too often, power consuming electronic components generate more internal heat rise than the enclosure is capable of dissipating on its own. Heat dissipation techniques include electronic component mounted heat sinks, heat pipes, heat spreaders, and increasing the enclosure physical size, all of which are designed to assist the natural connection of the enclosure assembly. Circulation fans can also be used to increase air movement across these devices. However, industrial embedded products typically have long life expectancies (up to ten years) and must be rated to work in temperature environments from −25 to +70 degrees Celsius (° C.) and cooling fans cannot reliably meet these requirements. Therefore, a solution is needed to either reduce the internal heat rise to begin with or to increase the enclosures capacity to dissipate more heat without increasing its physical size.

Reference can be made to U.S. Patent Application Publication No. 2013/0188320 A1, which discloses a mounting base used to secure circuit board assemblies. The mounting base includes fins to help remove heat away from the circuit board assemblies.

SUMMARY OF DISCLOSURE

One aspect of the present disclosure is directed to a mounting enclosure assembly configured to mount electronic components onto a DIN rail. In one embodiment, the mounting enclosure assembly includes a mounting bracket including a body having at least one elongate slot configured to receive an edge of the electronic component therein. The mounting enclosure assembly further includes a heat sink secured to the mounting bracket. The heat sink includes a mounting configuration configured to secure the heat sink and the mounting bracket to the DIN rail. The mounting enclosure assembly further includes a thermal bonding material disposed within the slot to secure the electronic component to the body of the mounting bracket within the slot.

Embodiments of the mounting enclosure assembly further may include providing the thermal bonding material with a flexible sheet that is wrapped along the edge of the electronic component. In a certain embodiment, the flexible sheet may embody a thermal foam pad. The thermal bonding material may include a thermal compound paste that is disposed within the slot prior to inserting the edge of the electronic substrate into the slot. The mounting configuration may include a slot having snap-fit protrusions that are sized to receive the DIN rail within the slot in snap-fit relation. The heat sink may include fins that extend toward the DIN rail. The mounting bracket may be fabricated from plastic material. The heat sink may be fabricated from aluminum material.

Another aspect of the present disclosure is directed to a mounting enclosure assembly configured to mount electronic components onto a DIN rail. In one embodiment, the mounting enclosure assembly includes a mounting bracket having a heat sink configured to secure the mounting bracket to the DIN rail and a retainer secured to the heat sink and configured to receive an edge of the electronic component therein. The mounting enclosure assembly further includes a thermal bonding material disposed within the retainer to secure the electronic component to the heat sink of the mounting bracket within the retainer.

Embodiments of the mounting enclosure assembly further may include providing the thermal bonding material with a flexible sheet that is wrapped along the edge of the electronic component. The flexible sheet may embody a thermal foam pad. The thermal bonding material may include a thermal compound paste that is disposed within the retainer prior to inserting the edge of the electronic substrate into the retainer. The mounting bracket may be fabricated from plastic material.

Yet another aspect of the present disclosure is directed to a method of mounting electronic components onto a DIN rail. In one embodiment, the method comprises: providing a mounting bracket, the mounting bracket including a body having a heat sink and at least one elongate slot formed in the body, the elongated slot being configured to receive an edge of the electronic component therein; disposing a thermal bonding material within the slot of the body of the mounting bracket; positioning the electronic component in the slot to secure the electronic component to the body of the mounting bracket within the slot; and securing the mounting bracket onto the DIN rail.

Embodiments of the method may include providing the thermal bonding material with a flexible sheet that is wrapped along the edge of the electronic component. The flexible sheet may embody a thermal foam pad. The thermal bonding material may include a thermal compound paste that is disposed within the slot prior to inserting the edge of the electronic substrate into the slot. The heat sink may include a mounting configuration configured to secure the mounting bracket to the DIN rail, the mounting configuration including a slot sized to receive the DIN rail within the slot. The heat sink may be configured to engage an edge of the DIN rail to hold the mounting bracket in place on the DIN rail. The mounting bracket may be fabricated from plastic material and the heat sink is fabricated from heat dissipating material.

BRIEF DESCRIPTION OF THE DRAWINGS

Various aspects of at least one embodiment are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements.

In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the disclosure. In the figures.

DETAILED DESCRIPTION

Figure 1:
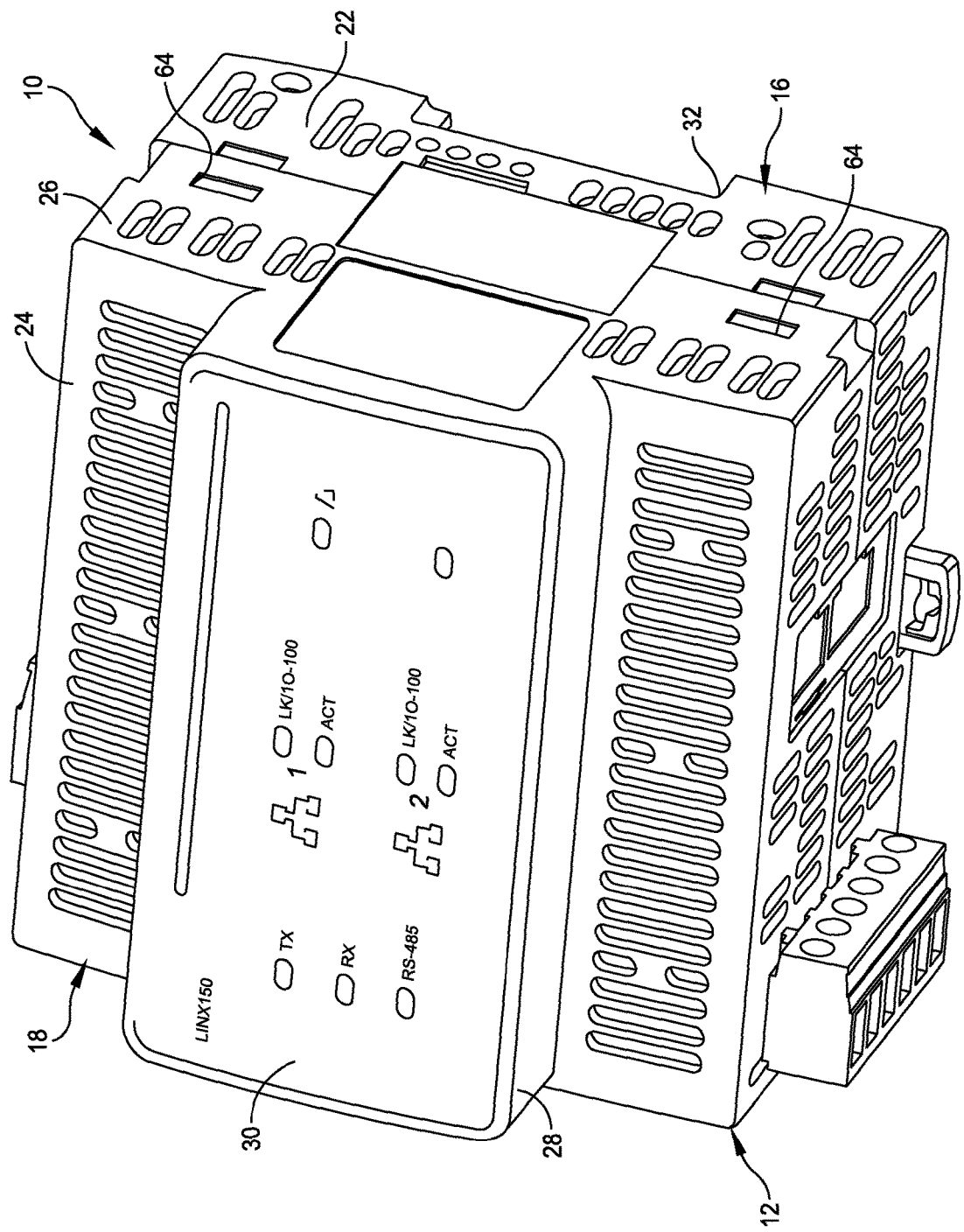
FIG. 1 is a front perspective view of a mounting enclosure assembly configured to support multiple printed circuit board assemblies (PCBAs)

As discussed above, traditional heat sinks suffer from several disadvantages, such as being increasingly large, heavy and costly. Accordingly, there is a need for a more efficient device, system and method of heat dissipation that is easier to construct and assemble, and takes advantage of the heat dissipating structure on which the device attaches. The assembly of the present disclosure includes the functionality of prior designs with enhanced performance.

The systems and methods disclosed herein enable DIN rail mountable enclosures to utilize the readily available metal mass of the DIN rail to function as a greater heat sink device. The systems and methods embody a combined DIN rail mounting bracket and heat sink assembly integrated with multiple printed circuit board assemblies (PCBAs), thermal bonding material, and a plastic DIN rail mountable enclosure. The combined DIN rail mounting bracket and heat sink device serves many purposes, including: 1) a DIN rail mounting bracket support mechanism; 2) a thermal bonding contact point with the DIN rail; 3) a thermal transfer point with the PCBAs; and 4) an integral part of the plastic enclosure assembly.

The systems and methods operate by heat absorption in which the heat generated from electronic components is absorbed into the cooler inner copper layers (thermal planes) of the PCBAs (or any other heat-generating component) and further drawn toward the even cooler metal mass of the DIN rail mounting bracket/heat sink device using a thermally conductive material, such as foam, compound, film, adhesive, or similar material. A groove cut into the DIN rail mounting bracket/heat sink device is filled with the thermal bonding material and the edge of the PCBA fits into the groove making thermal contact through the conductive bonding material. Other PCBAs can be mounted in the same fashion in other slots in the DIN rail mounting bracket/heat sink device. The PCBAs and DIN rail mounting bracket/heat sink sub-assembly snap fit together into the back of the plastic enclosure, thus integrating the assembly with the four main walls of the enclosure and also provides the DIN rail mounting mechanism. Installation of the plastic enclosure front cover is achieved by press fitting against an opposite edge of the assembly to hold all PCBAs and the DIN rail mounting bracket/heat sink assembly tightly together.

The entire assembly is mounted to the DIN rail and locked in place with the enclosure's locking mechanism. The DIN rail mounting bracket/heat sink assembly provides a solid metal to metal contact with the DIN rail, thus completing the thermal contact from the DIN rail and sub-panel materials and the internal PCBAs. The DIN rail assembly provides improved thermal capacity even when mounted on adiabatic materials. The net effect of the assembly is that the heat of electronic components inside the enclosure is absorbed into the PCBA inner copper layer thermal planes and drawn out of the plastic enclosure area through the aforementioned apparatus and finally transferred outside the enclosure and into the DIN rail and surrounding panel materials thus increasing the enclosures heat dissipation capacity.

As used herein, a DIN rail is a metal rail of a standard type widely used for mounting electronic components, such as circuit breakers, power modules and other types of industrial control equipment inside equipment racks. In one embodiment, the DIN rail can be made from cold rolled carbon steel sheet with a zinc-plated and chromed bright surface finish. The DIN rail also may be fabricated from aluminum, stainless steel, copper, or any other suitable thermally conductive metal or alloy material. The term "DIN" stands for Deutsches Institut für Normung of Germany. The DIN rail has been adopted by European (EN) and international (ISO) standards. In addition, as used herein, the term "heat-generating component" may refer to any electronic components or a group of components that generate heat, for example printed circuit board assemblies including electronic components, semiconductor devices, such as bipolar junction transistors, MOSFETs, diodes or IGBTs, to name a few.

Figure 2:
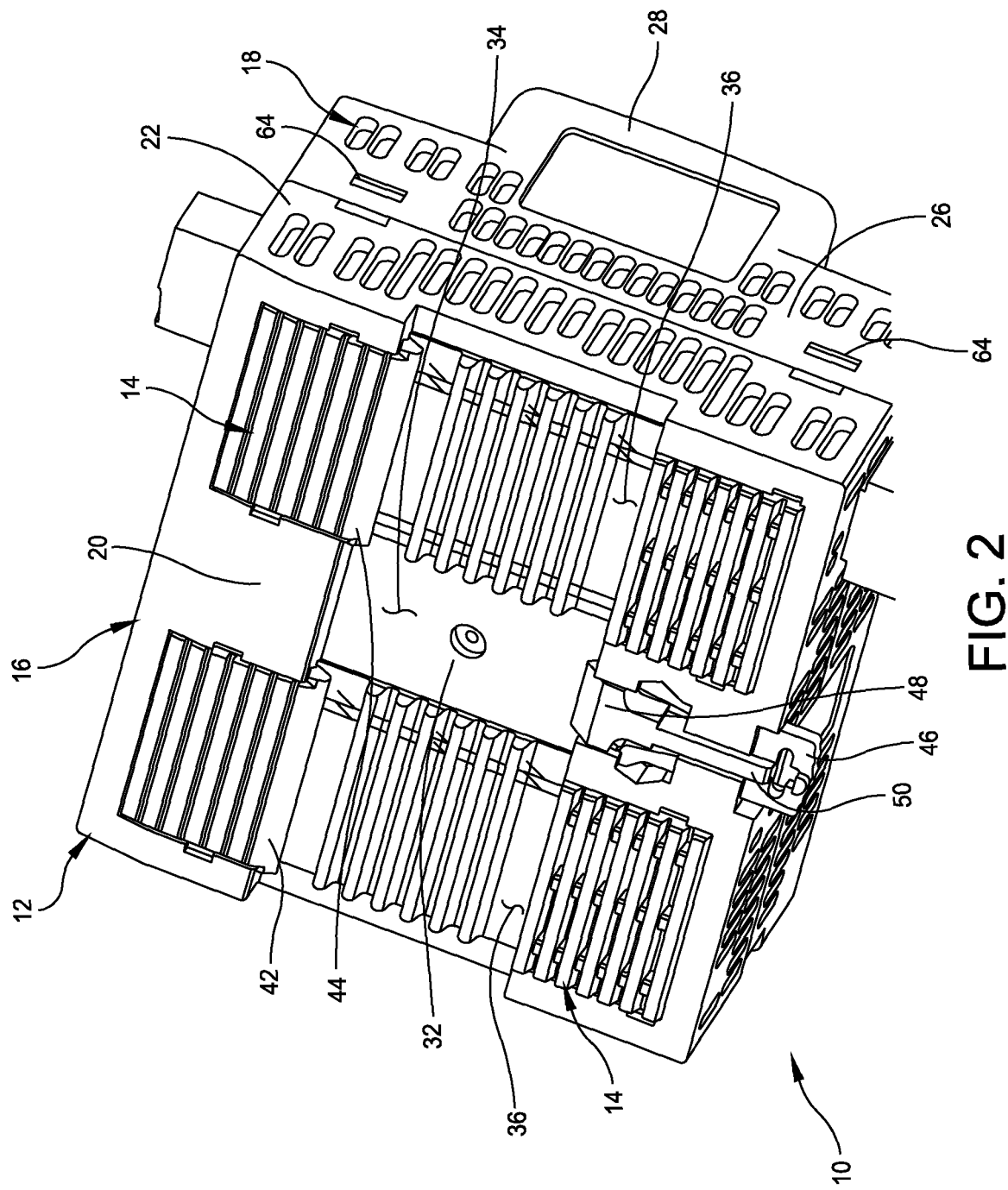
FIG. 2 is a back perspective view of the mounting enclosure assembly shown in FIG. 1.

Referring now to the drawings, and more particularly to FIGS. 1 and 2, a mounting enclosure assembly is generally indicated at 10. As shown, the mounting enclosure assembly 10 includes a mounting bracket, generally indicated at 12, and two heat sinks, each generally indicated at 14, which are secured to the mounting bracket. The mounting bracket 12 includes a body having a base generally indicated 16 and a cover generally indicated at 18, which is removably securable to the base. As shown, the base 16 and the cover 18 of the mounting bracket 12 when assembled form a generally box-shaped structure that is designed to house a plurality of PCBAs within the body. The manner in which the PCBAs are secured within the body of the mounting bracket 12 will be described in detail below.

In one embodiment, the base 16 includes a back wall 20 and a contiguous peripheral outer wall 22 that extends from the back wall. Similarly, the cover 18 includes a front wall 24 and a contiguous peripheral outer wall 26 that extends from the front wall. The outer wall 22 of the base 16 and the outer wall 26 of the cover 18 engage one another at peripheral edges when assembled to create a unified structure or body. As shown in FIG. 1, the front wall 24 of the cover 18 of the mounting bracket 12 includes a raised portion 28 having a display panel 30, which displays relevant information about the electronic components (e.g., PCBAs) housed within the mounting enclosure assembly 10. As shown in FIG. 2, the back wall 20 of the base 16 of the mounting bracket 12 includes a mounting configuration defined as a recessed slot 32 formed in the base. Although the mounting bracket 12 is shown and described as having the base 16 and the mating cover 18, it should be understood that the mounting bracket can be any size or shaped box or enclosure and still fall within the scope of the present disclosure.

Figure 3:
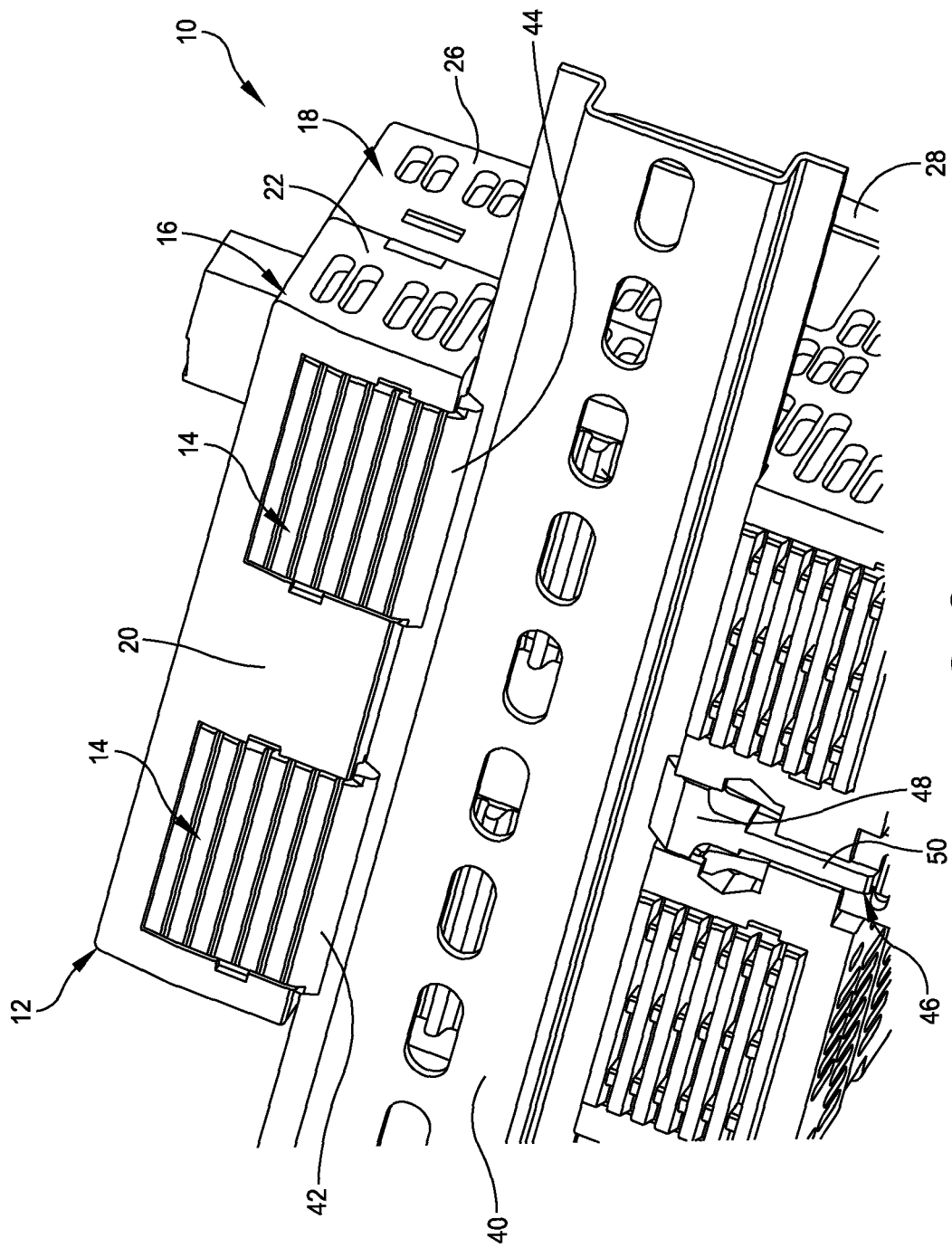
FIG. 3 is a back perspective view of the mounting enclosure assembly shown in FIG. 2 mounted on a DIN rail.
Figure 4:
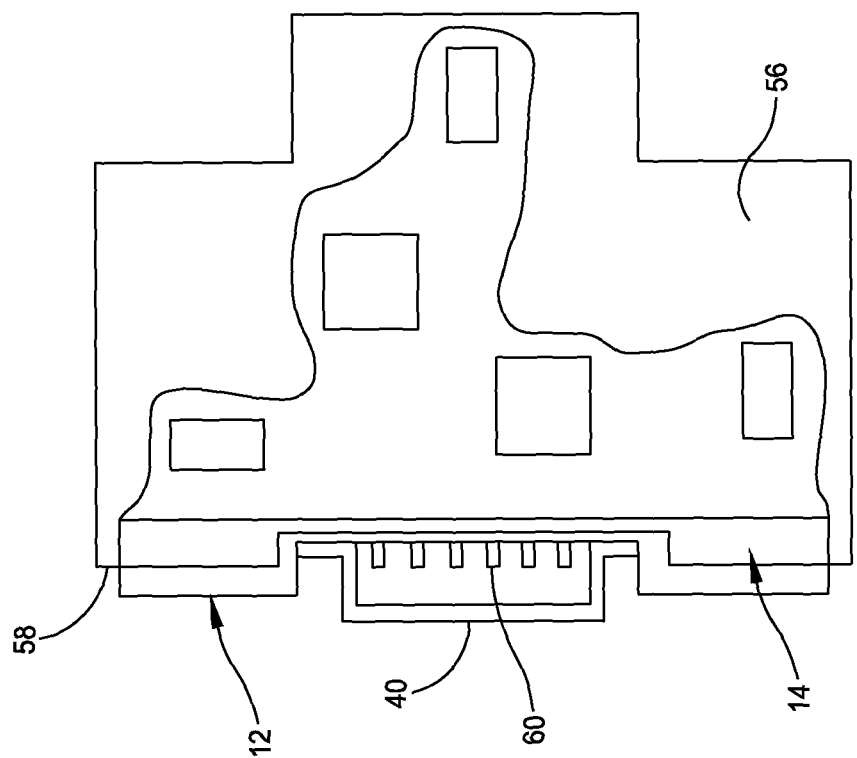
FIG. 4 is a cross-sectional view of the mounting enclosure assembly supporting a PCBA and secured to a DIN rail.

Referring to FIGS. 3 and 4, the heat sinks 14 are captured within the base 16 of the mounting bracket 12 so that the heat sinks form part of the back wall 20 of the base when the heat sinks are secured to the base. The arrangement is such that the heat sinks 14, when assembled with the base 16, in addition to forming part of the back wall 20 of the base also form part of the mounting configuration or recessed slot 32 that is shaped to secure the heat sink and the base to a DIN rail. Specifically, the recessed slot 32 is formed in an outer surface 34 of the back wall 20 of the base 16 and in a surface 36 of the heat sink to create a contiguous surface, and is sized to receive a DIN rail 40 therein in the manner best illustrated in FIG. 4. Although a portion of the recessed slot 32 formed in the back wall 20 of the base 16 may be configured to secure the base to the DIN rail 40, it is the portion of the recessed slot formed in the heat sinks 14 that are configured to receive and secure the heat sink and the base of the mounting bracket 12 to the DIN rail. As shown, each heat sink 14 includes a pair of oppositely facing protrusions 42, 44 that are designed to receive and secure the DIN rail 40 in a snap-fit fashion. As mentioned above, the base 16 of the mounting bracket 12 also can be formed with protrusions 42, 44 to secure the base of the mounting bracket to the DIN rail 40, if desired.

As mentioned, the heat sink material may be cast aluminum but can be a machined aluminum part as well. Although there are two heat sinks 14 integrated within the back wall 20 of the base 16 of the plastic mounting bracket 12, any number of heat sinks may be provided. The heat sinks 14 are secured in the base 16 with plastic clips that flex outward when the heat sink is set in place. These plastic clips are configured to overcome some physical stops, and then flex back inward and clip in place. These clips can be seen in FIG. 5. In one embodiment, the clips are an integral part of the base 20, with three on each side of each heat sink 14. In addition there are ledges built into the base 20 to receive and cradle the heat sinks 14. As described, each heat sink 14 is configured with the protrusions 42, 44 to engage an edge or flange of the DIN rail 40 to hold the mounting bracket 12 in place on the DIN rail. The heat sinks 14 of the mounting bracket serve at least two purposes: (1) providing a support structure as an integral part of the DIN rail hanger; and (2) providing a thermal contact point with the DIN rail 40 and sub-panel for heat transfer to panel chassis.

As best shown in FIG. 2, the back wall 20 of the base 16 of the mounting bracket 12 includes a locking mechanism generally indicated at 46 to releasably lock the mounting enclosure assembly to the DIN rail 40. The locking mechanism 46 includes a head portion 48 and a handle portion 50 that is connected to the head portion. The arrangement is such that the head portion 48 of the locking mechanism 46 can be slid into and away from the recessed slot 32 of the back wall 20 of the mounting bracket 12 by manipulating the handle portion 50. When slid into the recessed slot 32 by pushing the handle portion 50, the head portion 48 of the locking mechanism 46 engages or overlaps a flange of the DIN rail 40 to help secure the base 16 of the mounting bracket 12 to the DIN rail. The locking mechanism 46, along with the protrusions 42, 44 of each heat sink 14, secures the mounting bracket 12 to the DIN rail 40.

Figure 5:
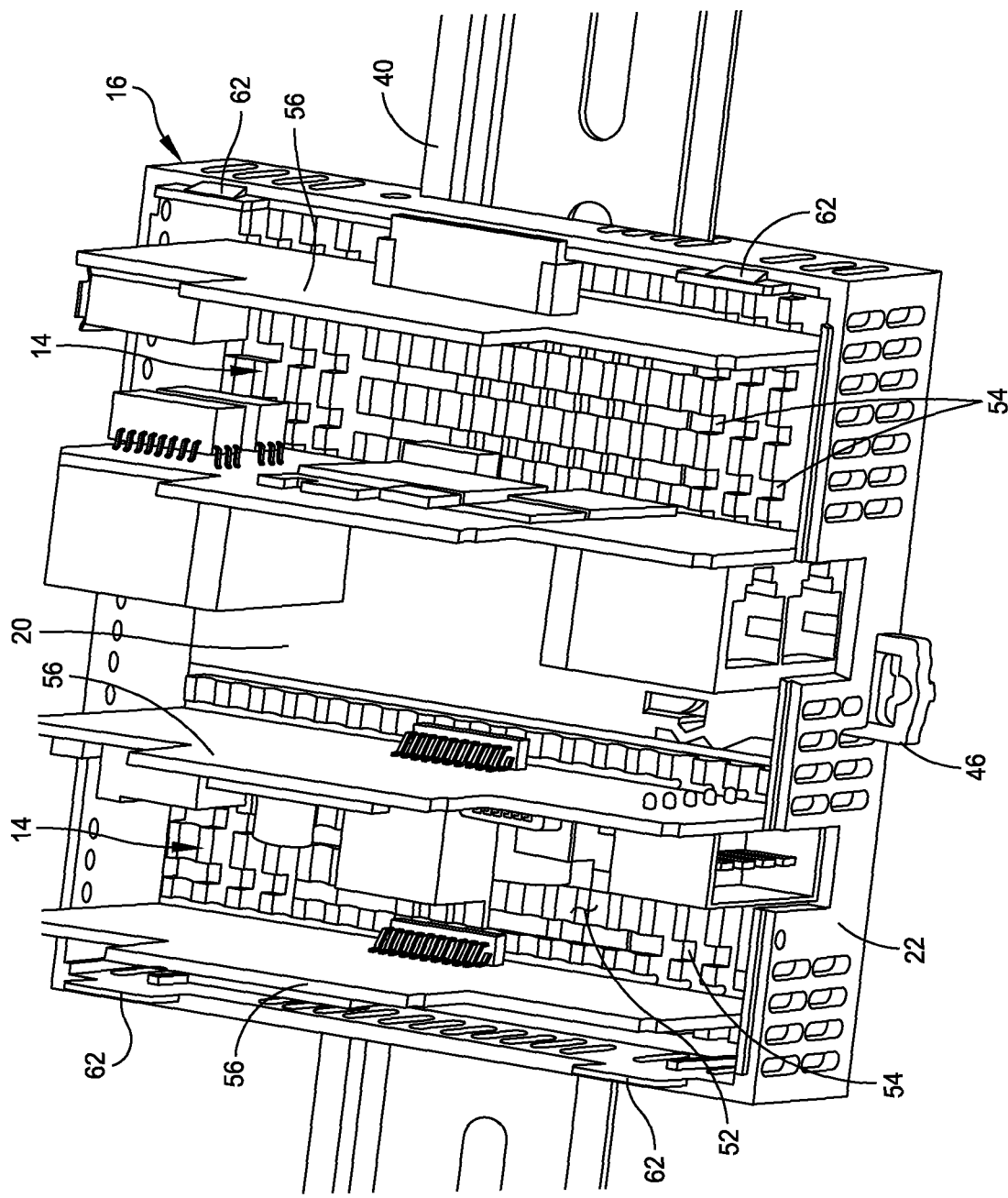
FIG. 5 is a front perspective view of the mounting enclosure assembly mounted on the DIN rail with a cover of the mounting enclosure assembly removed to reveal an interior of a base of the mounting enclosure assembly.
Figure 6:
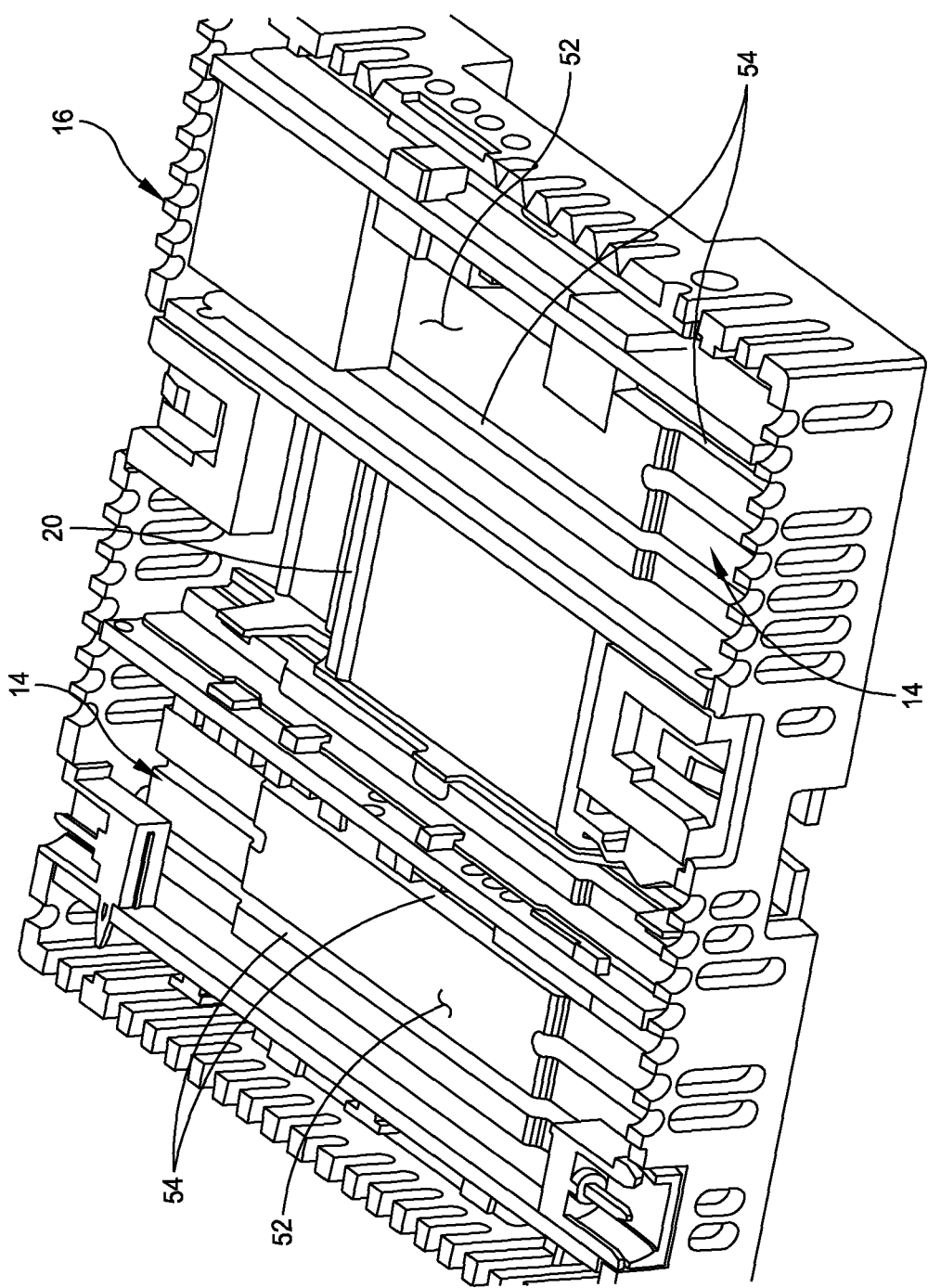
FIG. 6 is front cross-sectional perspective view of the mounting enclosure assembly showing portions of the interior of the base of the mounting enclosure assembly.

Referring to FIGS. 5 and 6, an interior of the mounting enclosure assembly 10 includes a plurality of slots to secure PCBAs within the mounting enclosure assembly. In one embodiment, a surface 52 of the heat sink 14 (opposite surface 36) has a plurality of slots, each indicated at 54, formed therein in a direction along a length of the heat sink. As shown, any number of slots 54 may be provided to accommodate a desired number of PCBAs, each indicated at 56. With the mounting enclosure assembly of the shown embodiment, there are four PCBAs. However, it is contemplated that the mounting enclosure assembly can be designed to accommodate any number of PCBAs and fall within the scope of the present disclosure. Each slot 54 is sized and configured to receive an edge 58 of the PCBA 56 therein. The arrangement is such that mounting bracket 12 can be fabricated to include heat sinks 14 that dissipate heat from the mounting bracket or opening(s) configured to receive and secure heat sink(s) therein.

The surface 36 of each heat sink 14 (i.e., the surface opposite to the surface 52 having the slots 54) includes a plurality of fins 60 that extend toward the DIN rail 40 within the recessed slot 32 when securing the mounting bracket 12 to the DIN rail. The fins 60 are provided to dissipate additional heat generated by the PCBA assemblies 56. The fins 60 also serve to increase the surface area contact of the heat sink 14 to the DIN rail 40.

As best shown in FIG. 5, the cover 18 is releasably secured to the base 16 by four tabs, each indicated at 62, that extend up from the outer wall 22 of the base 16 near the four corners of the base. The four tabs 62 are received within respective openings, each indicated at 64, formed in the cover 18 near the four corners of the cover. The tabs 62 are aligned with the openings 64 when positioning the cover 18 on the base 16 in the manner illustrated in FIGS. 1 and 2. The arrangement is such that when the cover 18 is placed in a position in which the tabs 62 are inboard with respect to outer wall 26 of the cover 18, and the cover is moved toward the base 16 so that a peripheral edge of the cover engages a peripheral edge of the base, the tabs extend through the openings 64 to secure the cover in place. To remove the cover 18, the tabs 62 are moved inboard with respect to the cover and removed from their respective openings 64 to enable the movement of the cover away from the base 16.

Figure 7:
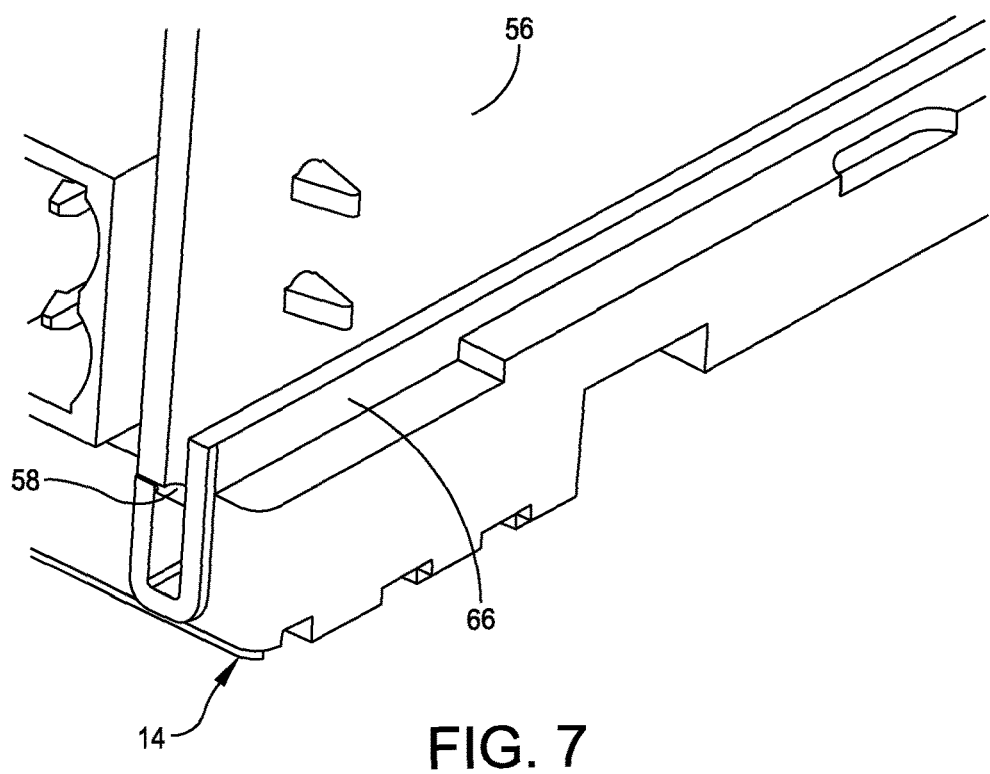
FIG. 7 is an enlarged perspective view of the mounting enclosure assembly having thermal bonding material to secure the PCBA to the base of the mounting enclosure assembly.
Figure 8:
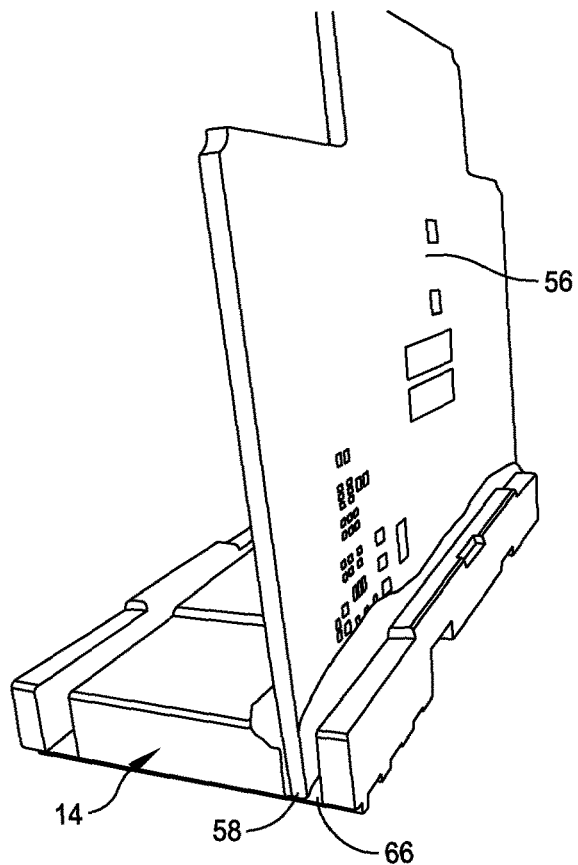
FIG. 8 is a side perspective view of the mounting enclosure assembly having the thermal bonding material.
Figure 9:
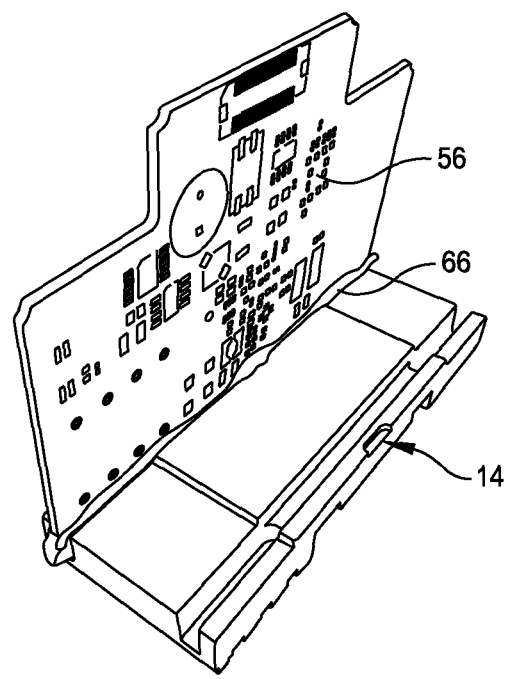
FIG. 9 is another perspective view of the mounting enclosure assembly shown in FIG. 8.

FIGS. 7-9 illustrate the manner in which the PCBAs 56 are fitted within respective slots of the heat sink 14 to secure the PCBAs within the mounting bracket 12 of the mounting enclosure assembly 10. As shown, the mounting enclosure assembly 10 further includes PCBA bonding material 66 disposed within the slot 54 of the heat sink 14. In embodiments of the present disclosure, this bonding material 66 is achieved by wrapping the edge 58 of the PCBA 56 with a thermal transfer material, such as a film or a thermal foam pad, e.g., 3M 5589H, or by filling the heat sink mounting slot 54 with a thermal compound paste, and then inserting the PCBA into the slot formed in the heat sink 14. This bonding material 66 is press fit into the slot 54 of the heat sink 14. For each slot 54, the stack up interfering tolerances of the heat sink 14, the thermal bonding material 66, the PCBA 56, and the plastic mounting bracket 12 are relied upon to secure the PCBA, and hold the PCBA in place. In certain embodiments, no other board mounting device is used. FIGS. 8 and 9 show PCBA thermal transfer contact area of the heat sink 14.

Figure 10:
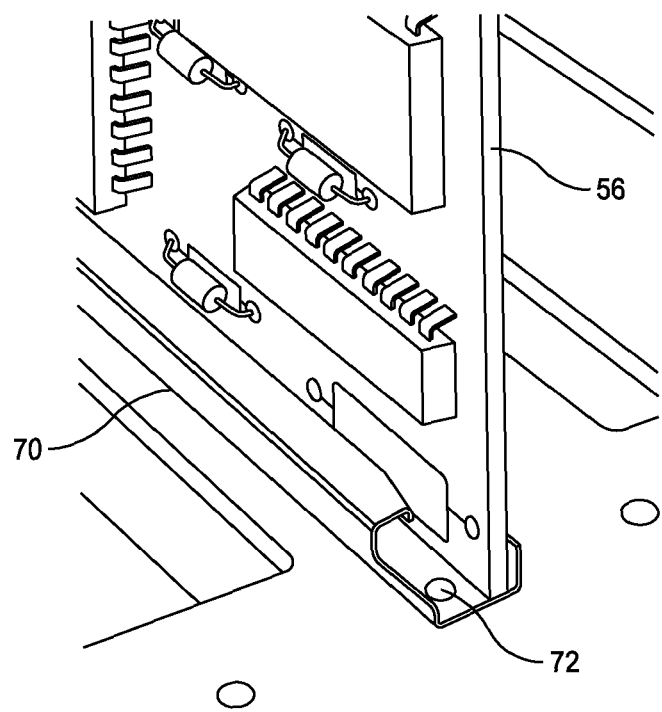
FIG. 10 is an enlarged perspective view of a mounting enclosure assembly of another embodiment having a mounting fixture used to secure a PCBA on a heat sink.

FIG. 10 illustrates an alternate PCBA mounting solution, which, in one embodiment, includes a commercial retaining bracket 70, such as a PCB-Tainer™ provided by Birtcher Products of San Diego, Calif. This solution requires the thermal bonding material 66; however, the retaining bracket 70 is attached to the heat sink 14 by suitable fasteners 72, such as screws, rivets, and/or bolts/nuts, and the PCBA 56 is inserted in the retaining bracket. Several models of the retaining bracket 70 are available, some with an integrated locking mechanism and some with spring retention clips. In one embodiment, the retaining bracket 70 may include beryllium copper retainers having a low-cost spring-action card retention design. The retainers attach to the heat sink using screws, rivets or adhesives and are designed primarily for use in sheet metal applications. The retainers provide protection against shock and vibration and offer excellent grounding characteristics.

Methods of mounting electronic components (e.g., PCBAs) onto the DIN rail are further disclosed. In one embodiment, a method includes providing a mounting bracket and disposing a thermal bonding material within the slot of the body of the mounting bracket. The electronic component is positioned in the slot to secure the electronic component to the body of the mounting bracket within the slot. The mounting bracket is then secured to the mounting bracket onto the DIN rail. As mentioned above, in one embodiment the thermal bonding material includes a flexible sheet that is wrapped along the edge of the electronic component. The flexible sheet can include a thermal foam pad. In another embodiment, the thermal bonding material includes a thermal compound paste that is disposed within the slot prior to inserting the edge of the electronic substrate into the slot.

An alternate embodiment may include constructing an entire rear surface of the enclosure out of the heat sink material or make the entire enclosure out of the heat sink material rather than integrating the heat sink into the enclosure plastic. An alternate design might construct the heat sinks out of a different type of material other than aluminum. An alternate design might shape the heat sinks differently, add airflow fins, change the contact points with the DIN rail, or even add thermal bonding material between the heat sink and the DIN rail contact point on the sub-panel chassis.

Thus, it should be observed that the methods for assembling heat sinks of the present disclosure produce heat sinks that are as efficient as heat sinks that are used with forced cooling. However, heat sinks produced in the manner disclosed herein are less expensive to make, and are more efficient.

It is to be appreciated that embodiments of the devices and methods discussed herein are not limited in application to the details of construction and the arrangement of components set forth in the following description or illustrated in the accompanying drawings. The devices and methods are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. A mounting enclosure assembly configured to mount electronic components onto a DIN rail, the mounting enclosure assembly comprising:

a mounting bracket including a body having at least one elongated slot configured to receive an edge of a printed circuit board assembly therein, and a raised portion having a display panel, which displays information about the printed circuit board assembly, the printed circuit board assembly housed within the mounting enclosure assembly;

a heat sink secured to the mounting bracket, the heat sink including a mounting configuration configured to secure the heat sink and the mounting bracket to the DIN rail; and a thermal bonding material disposed within the at least one elongated slot to secure the printed circuit board assembly to the body of the mounting bracket within the at least one elongated slot, wherein a back wall of the body of the mounting bracket includes a locking mechanism comprising a head portion and a handle portion that is connected to the head portion, and wherein the locking mechanism is used for releasably locking the mounting enclosure assembly to the DIN rail by pushing the handle portion so that the head portion overlaps a flange of the DIN rail and slides into a recessed slot of the back wall of the mounting bracket.

2. The mounting enclosure assembly of claim 1, wherein the thermal bonding material includes a flexible sheet that is wrapped along the edge of the printed circuit board assembly.

3. The mounting enclosure assembly of claim 2, wherein the flexible sheet embodies a thermal foam pad.

4. The mounting enclosure assembly of claim 1, wherein the thermal bonding material includes a thermal compound paste that is disposed within the at least one elongated slot prior to inserting the edge of the printed circuit board assembly into the at least one elongated slot.

5. The mounting enclosure assembly of claim 1, wherein the mounting configuration includes a slot having snap-fit protrusions that are sized to receive, in snap-fit relation, the DIN rail within the slot having the snap-fit protrusions.

6. The mounting enclosure assembly of claim 5, wherein the heat sink includes fins that extend toward the DIN rail.

7. The mounting enclosure assembly of claim 1, wherein the mounting bracket is fabricated from plastic material.

8. The mounting enclosure assembly of claim 7, wherein the heat sink is fabricated from aluminum material.

9. A mounting enclosure assembly configured to mount electronic components onto a DIN rail, the mounting enclosure assembly comprising:
   a mounting bracket including a heat sink configured to secure the mounting bracket to the DIN rail, a retainer secured to the heat sink and configured to receive an edge of a printed circuit board assembly therein, a body, and a raised portion having a display panel, which displays information about the printed circuit board assembly, the printed circuit board assembly housed within the mounting enclosure assembly; and
   a thermal bonding material disposed within the retainer to secure the printed circuit board assembly to the heat sink of the mounting bracket within the retainer,
   wherein a back wall of the body of the mounting bracket includes a locking mechanism comprising a head portion and a handle portion that is connected to the head portion, and wherein the locking mechanism is used for releasably locking the mounting enclosure assembly to the DIN rail by pushing the handle portion so that the head portion overlaps a flange of the DIN rail and slides into a recessed slot of the back wall of the mounting bracket.

10. The mounting enclosure assembly of claim 9, wherein the thermal bonding material includes a flexible sheet that is wrapped along the edge of the printed circuit board assembly.

11. The mounting enclosure assembly of claim 10, wherein the flexible sheet embodies a thermal foam pad.

12. The mounting enclosure assembly of claim 9, wherein the thermal bonding material includes a thermal compound paste that is disposed within the retainer prior to inserting the edge of the printed circuit board assembly into the retainer.

13. The mounting enclosure assembly of claim 9, wherein the mounting bracket is fabricated from plastic material.

14. A mounting enclosure assembly configured to mount electronic components onto a DIN rail, the mounting enclosure assembly comprising:
   a mounting bracket including a body having a slot configured to receive an edge of a printed circuit board assembly therein, the printed circuit board assembly housed within the mounting enclosure assembly;
   a heat sink secured to the mounting bracket, the heat sink including a mounting configuration configured to secure the heat sink and the mounting bracket to the DIN rail; and
   a thermal bonding material disposed within the slot to secure the printed circuit board assembly to the body of the mounting bracket within the slot,
   wherein a back wall of the body of the mounting bracket includes a locking mechanism comprising a head portion and a handle portion that is connected to the head portion, and wherein the locking mechanism is used for releasably locking the mounting enclosure assembly to the DIN rail by pushing the handle portion so that the head portion overlaps a flange of the DIN rail and slides into a recessed slot of the back wall of the mounting bracket.

15. The mounting enclosure assembly of claim 14, wherein the thermal bonding material includes a flexible sheet that is wrapped along the edge of the printed circuit board assembly.

16. The mounting enclosure assembly of claim 15, wherein the flexible sheet embodies a thermal foam pad.

17. The mounting enclosure assembly of claim 14, wherein the thermal bonding material includes a thermal compound paste that is disposed within the at least one elongated slot prior to inserting the edge of the printed circuit board assembly into the at least one elongated slot.

18. The mounting enclosure assembly of claim 14, wherein the mounting configuration includes a slot having snap-fit protrusions that are sized to receive, in snap-fit relation, the DIN rail within the slot having the snap-fit protrusions.

19. The mounting enclosure assembly of claim 18, wherein the heat sink includes fins that extend toward the DIN rail.

20. The mounting enclosure assembly of claim 14, wherein the mounting bracket is fabricated from plastic material.

21. The mounting enclosure assembly of claim 20, wherein the heat sink is fabricated from aluminum material.

* * * * *